(12) United States Patent
Takahashi et al.

(10) Patent No.: US 9,446,657 B2
(45) Date of Patent: Sep. 20, 2016

(54) VEHICLE DRIVING DEVICE

(71) Applicant: AISIN AW CO., LTD., Anjo-shi, Aichi-ken (JP)

(72) Inventors: Katsutoshi Takahashi, Nishio (JP); Hiroyuki Fujioka, Okazaki (JP); Tatsuyuki Uechi, Toyoake (JP); Manabu Miyazawa, Anjo (JP)

(73) Assignee: AISIN AW CO., LTD., Anjo (JP)

( * ) Notice: Subject to any disclaimer, the term of this patent is extended or adjusted under 35 U.S.C. 154(b) by 0 days.

(21) Appl. No.: 14/780,130

(22) PCT Filed: Mar. 26, 2014

(86) PCT No.: PCT/JP2014/058609
§ 371 (c)(1),
(2) Date: Sep. 25, 2015

(87) PCT Pub. No.: WO2014/192394
PCT Pub. Date: Dec. 4, 2014

(65) Prior Publication Data
US 2016/0039276 A1    Feb. 11, 2016

(30) Foreign Application Priority Data

May 31, 2013  (JP) .................................. 2013-116027
Sep. 24, 2013  (JP) .................................. 2013-197531

(51) Int. Cl.
*B60K 6/405*    (2007.10)
*B60K 6/40*     (2007.10)
(Continued)

(52) U.S. Cl.
CPC ................ *B60K 6/405* (2013.01); *B60K 6/26* (2013.01); *B60K 6/36* (2013.01); *B60K 6/40* (2013.01);
(Continued)

(58) Field of Classification Search
CPC .......... B60K 6/405; B60K 6/36; B60K 6/26; B60L 15/007; Y10S 903/906; Y10S 903/909; Y10S 903/951; Y10S 903/952
See application file for complete search history.

(56) References Cited

U.S. PATENT DOCUMENTS 5,352,853 A * 10/1994 Takagi ..................... H01R 4/70
                                                          174/152 R
5,875,691 A *  3/1999 Hata ...................... B60K 6/365
                                                              475/5
(Continued)

FOREIGN PATENT DOCUMENTS

JP    2000-023307 A    1/2000
JP    2000-217205 A    8/2000
(Continued)

OTHER PUBLICATIONS

U.S. Appl. No. 14/780,155, filed Sep. 25, 2015 in the name of Kuramochi et al.
(Continued)

*Primary Examiner* — Katy M Ebner
*Assistant Examiner* — Brian Cassidy
(74) *Attorney, Agent, or Firm* — Oliff PLC

(57) ABSTRACT

A vehicle driving device that includes a rotary electrical machine that functions as a driving force source of a wheel along with an internal combustion engine; a transmission device that is disposed side by side with respect to the rotary electrical machine in an axial direction, the axial direction being a direction in which a rotation axis center of the rotary electrical machine extends; a case including a first case section that accommodates the rotary electrical machine and a second case section that accommodates the transmission device; an inverter device that controls the rotary electrical machine; and a wiring member that connects the rotary electrical machine and the inverter device.

4 Claims, 6 Drawing Sheets

(51) Int. Cl.
  *B60K 6/48* (2007.10)
  *B60L 11/14* (2006.01)
  *B60L 15/00* (2006.01)
  *H05K 5/06* (2006.01)
  *H05K 7/14* (2006.01)
  *B60K 6/26* (2007.10)
  *B60K 6/36* (2007.10)

(52) U.S. Cl.
  CPC ............... *B60K 6/48* (2013.01); *B60L 11/14* (2013.01); *B60L 15/007* (2013.01); *H05K 5/061* (2013.01); *H05K 7/1432* (2013.01); *B60Y 2400/61* (2013.01); *Y02T 10/6221* (2013.01); *Y02T 10/645* (2013.01); *Y02T 10/70* (2013.01); *Y02T 10/7077* (2013.01); *Y10S 903/906* (2013.01); *Y10S 903/909* (2013.01); *Y10S 903/951* (2013.01); *Y10S 903/952* (2013.01)

(56) References Cited

U.S. PATENT DOCUMENTS

| | | | |
|---|---|---|---|
| 6,118,237 A | 9/2000 | Kikuchi et al. | |
| 6,166,498 A | 12/2000 | Yamaguchi et al. | |
| 6,460,642 B1* | 10/2002 | Hirano | B60K 6/40 180/271 |
| 7,211,912 B2* | 5/2007 | Takenaka | B60K 6/365 310/52 |
| 7,786,640 B2* | 8/2010 | Sada | B60K 6/365 310/112 |
| 7,851,954 B2* | 12/2010 | Endo | B60K 6/26 310/68 D |
| 8,344,564 B2* | 1/2013 | Yoshida | B60K 6/365 310/112 |
| 8,344,566 B2* | 1/2013 | Koshida | B60K 6/26 310/85 |
| 8,444,518 B2* | 5/2013 | Tanae | B60K 6/405 475/5 |
| 8,448,541 B2* | 5/2013 | Kasuya | B60K 6/387 180/65.245 |
| 8,770,326 B2* | 7/2014 | Matano | B60K 1/04 180/65.1 |
| 8,875,825 B2* | 11/2014 | Asakura | B60K 6/405 180/68.4 |
| 9,247,675 B2* | 1/2016 | Higuchi | B60L 11/1803 |
| 9,295,186 B2* | 3/2016 | Ivan | H05K 9/0007 |
| 9,301,434 B2* | 3/2016 | Kuwano | H02M 7/003 |
| 2001/0023776 A1* | 9/2001 | Zingheim | H01B 3/445 174/72 A |
| 2002/0060099 A1 | 5/2002 | Takenaka et al. | |
| 2004/0226761 A1 | 11/2004 | Takenaka et al. | |
| 2005/0208782 A1* | 9/2005 | Reed | H01R 4/307 439/34 |
| 2009/0071784 A1 | 3/2009 | Combs et al. | |
| 2009/0100965 A1 | 4/2009 | Sanji et al. | |
| 2009/0206709 A1 | 8/2009 | Kakuda et al. | |
| 2010/0084206 A1 | 4/2010 | Yoshida et al. | |
| 2010/0127586 A1 | 5/2010 | Yoshida et al. | |
| 2012/0248909 A1 | 10/2012 | Ito et al. | |
| 2014/0132379 A1* | 5/2014 | Vafakhah | H01F 37/00 336/57 |
| 2014/0202402 A1* | 7/2014 | Triantos | B60K 6/405 123/41.01 |
| 2014/0293569 A1* | 10/2014 | Bougeard | B60L 3/0007 361/809 |
| 2014/0345492 A1* | 11/2014 | Fujito | H02P 27/06 105/61 |
| 2015/0029666 A1* | 1/2015 | Kosuga | H02M 3/28 361/699 |
| 2015/0256096 A1* | 9/2015 | Nishizawa | H01G 2/04 363/131 |
| 2015/0314692 A1* | 11/2015 | Inoue | B62K 19/30 318/139 |
| 2015/0314830 A1* | 11/2015 | Inoue | B60K 1/04 180/220 |
| 2016/0039276 A1 | 2/2016 | Takahashi et al. | |
| 2016/0052380 A1* | 2/2016 | Miyazawa | B60K 6/26 180/65.21 |
| 2016/0072361 A1 | 3/2016 | Kuramochi et al. | |

FOREIGN PATENT DOCUMENTS

| | | |
|---|---|---|
| JP | 2001-119898 A | 4/2001 |
| JP | 2001-187535 A | 7/2001 |
| JP | 2001-322439 A | 11/2001 |
| JP | 2002-120575 A | 4/2002 |
| JP | 2004-153897 A | 5/2004 |
| JP | 2004-215348 A | 7/2004 |
| JP | 2004-222354 A | 8/2004 |
| JP | 2004-343845 A | 12/2004 |
| JP | 2007-166803 A | 6/2007 |
| JP | 2008-290621 A | 12/2008 |
| JP | 2008-301572 A | 12/2008 |
| JP | 2009-101730 A | 5/2009 |
| JP | 2009-201218 A | 9/2009 |
| JP | 2011-067093 A | 3/2011 |
| JP | 2011-213230 A | 10/2011 |
| JP | 2012-065436 A | 3/2012 |
| JP | 2012-121549 A | 6/2012 |
| JP | 2012-162132 A | 8/2012 |
| JP | 2012-217263 A | 11/2012 |
| WO | 2009-104491 A1 | 8/2009 |
| WO | 2014/192376 A1 | 12/2014 |

OTHER PUBLICATIONS

U.S. Appl. No. 14/780,335, filed Sep. 25, 2015 in the name of Suzuki et al.

U.S. Appl. No. 14/780,135, filed Sep. 25, 2015 in the name of Miyazawa et al.

* cited by examiner

VEHICLE DRIVING DEVICE

BACKGROUND

The present disclosure relates to a vehicle driving device including a rotary electrical machine, and an inverter device for controlling the rotary electrical machine.

For example, a rotary electrical machine included in a driving device as a driving force source of a wheel or a kinetic energy regenerating device in a hybrid vehicle normally requires an inverter device configured with a switching element as a main body. The rotary electrical machine and the inverter device are electrically connected using a wiring member, and thus can be disposed at different positions from each other. However, the rotary electrical machine and the inverter device are desirably integrated in one case in view of the convenience in mounting on to the vehicle. From such standpoint, the vehicle driving device in which an inverter device [inverters 41, 42] for controlling a rotary electrical machine [generator 1, motor 2] is integrated with a case [driving device case 3] for accommodating the rotary electrical machine, and the like is disclosed in Japanese Patent Application Publication No. 2004-343845.

In the device of Japanese Patent Application Publication No. 2004-343845, the case includes a first case section [front case 31] for accommodating one rotary electrical machine [generator 1] and a second case section [rear case 32] for accommodating the other rotary electrical machine [motor 2] and a transmission device [under drive device U]. The first case section and the second case section are joined to each other in an axial direction (direction in which a rotation axis center of the rotary electrical machine extends). A cover member [inverter case 40 and cover 46] is attached to cross the first case section and the second case section, and the inverter device is accommodated in a space formed inside thereof.

However, the structure in which the cover member is provided across the first case section and the second case section as in Japanese Patent Application Publication No. 2004-343845 has a problem in that the physical size of the entire device tends to become large. Furthermore, a relatively complex seal structure is required to prevent liquid such as water, oil, and the like from entering an accommodation chamber of the inverter device. For example, in the structure shown in FIG. 5 of Japanese Patent Application Publication No. 2004-343845, a seal member [52 A, 52 B] for sealing between the cover member and the case sections is required for each of the first case section and the second case section. In the structure shown in FIG. 3 of Japanese Patent Application Publication No. 2004-343845, a common seal member [52] that is provided across the first case section and the second case section is used. In this case, a seal member that can absorb a step difference is required and a relatively great amount of seal member is also required on a mating surface between the two case sections.

In the device of Japanese Patent Application Publication No. 2004-343845, the wiring member extending from the inverter device is inserted into a through hole provided in the outer peripheral wall of the first case section and then connected to the rotary electrical machine in the first case section, and the wiring member is disposed in a space on the outer peripheral side of the first case section. Thus, a seal member provided across the first case section and the second case section is required to appropriately seal the entire wiring structure. A seal structure related to the cover member can be simplified by providing the cover member only on the second case section. However, two areas, between the wiring member and the cover member and between the wiring member and the first case section, are required as the sealing area of the wiring member, and hence a complex seal structure is required as a whole in the result.

As described in Japanese Patent Application Publication No. 2008-301572, a structure in which a wiring member introduced from an inverter device [PCU 300] to a case [divided accommodation case 13 and divided accommodation case 23] is connected to a rotary electrical machine [motor generator MG1] in the case is also known. However, Japanese Patent Application Publication No. 2008-301572 does not refer to the seal structure.

SUMMARY

According to an exemplary aspect of the present disclosure, the entire vehicle driving device is downsized including the inverter device and a seal structure of the inverter accommodation chamber is simplified.

A vehicle driving device according to an exemplary aspect of the present disclosure includes: a rotary electrical machine that functions as a driving force source of a wheel along with an internal combustion engine; a transmission device that is disposed side by side with respect to the rotary electrical machine in an axial direction, the axial direction being a direction in which a rotation axis center of the rotary electrical machine extends; a case including a first case section that accommodates the rotary electrical machine and a second case section that accommodates the transmission device; an inverter device that controls the rotary electrical machine; and a wiring member that connects the rotary electrical machine and the inverter device; wherein an oil-tight space in which the first case section and the second case section are communicated, is formed, the second case section being joined to a side opposite to the internal combustion engine side in the axial direction of the first case section; an inverter accommodation chamber that accommodates the inverter device is formed between the second case section and a cover member joined to the second case section; the rotary electrical machine is accommodated in the oil-tight space; the wiring member is provided to pass through the second case section so as to cross the inverter accommodation chamber and the oil-tight space; and a seal member that seals between the second case section and the wiring member is provided.

In the present application, the term "rotary electrical machine" is a concept that includes a motor (electrical motor), a generator (power generator), and a motor generator that has the functions of both the motor and the generator, as needed.

According to the characteristic configuration, the cover member for forming the inverter accommodation chamber between the case and the cover member is fitted only within a range occupied by the second case section without crossing the first case section and the second case section. Thus, with the wiring member being provided to pass through the second case section, the seal structure for preventing liquid such as water, oil, and the like from mixing into the inverter accommodation chamber is simplified. That is, an appropriate seal structure can be easily realized by simply sealing between the cover member and the second case section, and between the second case section and the wiring member through simple methods. In particular, the sealing between the wiring member and the case is performed in only one area where the wiring member passes through the second case section since the rotary electrical machine is disposed in the communicated oil-tight space formed in the first case section and the second case section. Thus, both the seal structure of the inverter accommodation chamber and the seal of the wiring member can be simplified.

Furthermore, since the cover member can be fitted only within the range occupied by the second case section, the physical size of the entire device can be reduced. Furthermore, since the inverter device is disposed at a position spaced farther apart from the internal combustion engine when the mounting state on the vehicle is taken into consideration, the inverter device can be disposed in a relatively large space avoiding the auxiliary machines disposed in the vicinity of the internal combustion engine. Thus, the in-vehicle mountability of the entire vehicle driving device including the inverter device can be improved.

Preferred aspects of the present disclosure will be described below.

According to one aspect, preferably, the case further includes an intermediate wall disposed between the rotary electrical machine and the transmission device in the axial direction; the wiring member is provided through a through hole formed in the intermediate wall in the oil-tight space; and the through-hole is formed at a position overlapping the rotary electrical machine as viewed in the axial direction.

In the present application, with respect to the positions of two members, the phrase "overlapping as viewed in a certain direction" means that when a virtual line parallel to a viewing direction is moved in each direction orthogonal to the virtual line, a region where the virtual line intersects both of the two members exists in at least one part.

According to such configuration, even if the intermediate wall exists between the rotary electrical machine and the transmission device, the path length of the wiring member can be suppressed to be short by providing the wiring member so as to pass through the through hole formed in the intermediate wall. In particular, since the through hole overlaps the rotary electrical machine as viewed in the axial direction, the wiring member can be linearly disposed along the axial direction, and the path length of the wiring member can be suppressed to be as short as possible. Furthermore, since the wiring member can be introduced into the first case section on the radially inner side than the end on the radially outer side from the rotary electrical machine, the enlargement in the radial direction of the first case section can be suppressed. Therefore, the space for disposing the auxiliary machines can be easily ensured in the in-vehicle state. The tool clearance for fastening the vehicle driving device and the internal combustion engine with a bolt can also be easily ensured.

According to another aspect, preferably, the rotary electrical machine includes a stator with a stator core and a coil disposed in the stator core; the coil includes two coil end portions respectively projecting toward both sides in the axial direction from the stator core; and a connection terminal of the coil with the wiring member is provided on the coil end portion on the transmission device side in the axial direction of the two coil end portions.

According to such configuration, the wiring member extending from an internal space of the second case section disposed on the transmission device side with respect to the rotary electrical machine can be connected to the connection terminal of the coil with a short wiring length.

DETAILED DESCRIPTION OF THE EMBODIMENTS

An embodiment of a vehicle driving device according to the present disclosure will be described with reference to the drawings. A vehicle driving device 1 according to the present embodiment is a vehicle driving device (hybrid vehicle driving device) for driving a vehicle (hybrid vehicle) including both an internal combustion engine E and a rotary electrical machine MG as a driving force source of a wheel W. Specifically, the vehicle driving device 1 is configured as a driving device for a single-motor parallel type hybrid vehicle. In the following description, the direction, position, and the like for each member may allow a difference caused by an error tolerable in manufacturing. The direction for each member represents the direction in a state in which the members are assembled to the vehicle driving device 1.

Figure 1:
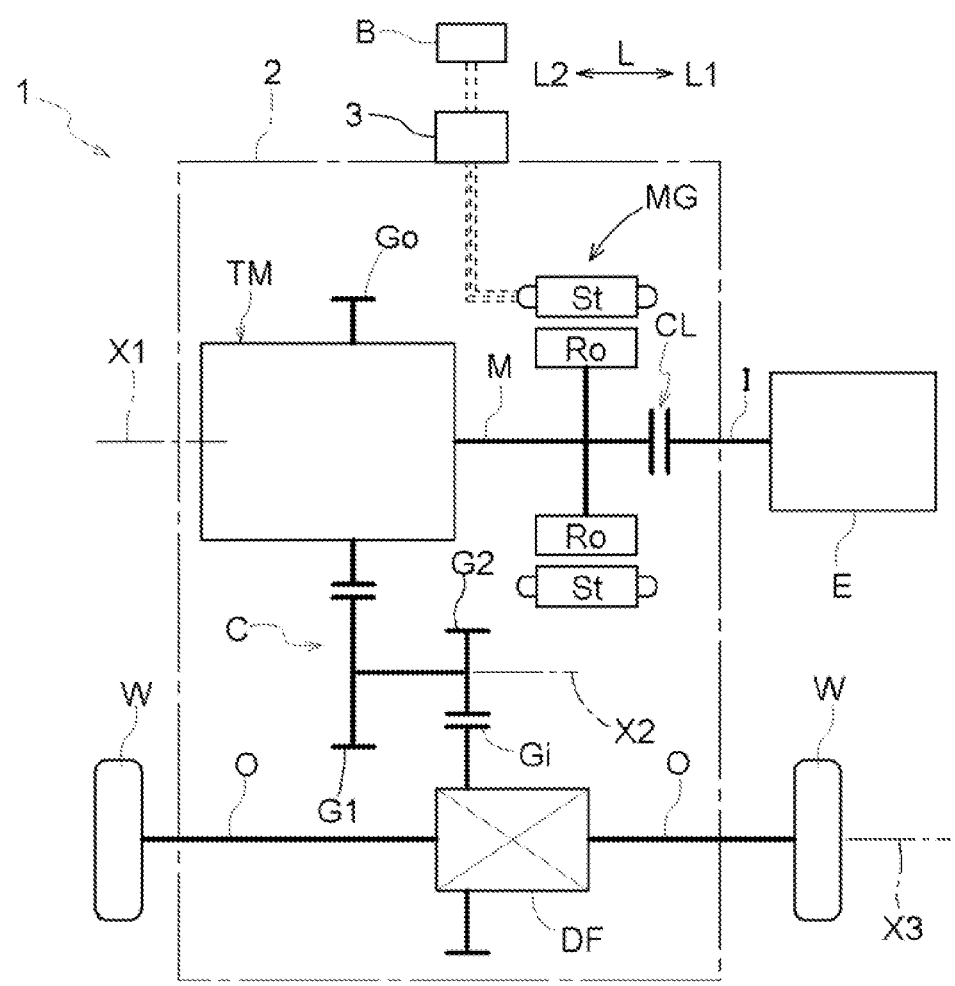
FIG. 1 is a schematic view showing a schematic configuration of a vehicle driving device.

As shown in FIG. 1, the vehicle driving device 1 includes an input shaft I drivingly connected to the internal combustion engine E, a plurality of (two in the present example) output shafts O respectively drivingly connected to a plurality of (two in the present example) wheels W, a rotary electrical machine MG, and a transmission device TM. The term "drivingly connect" means a state in which two rotational elements are connected such that a driving force (synonym for torque) can be transmitted. This concept also includes a state in which the two rotational elements are connected so as to rotate together, and a state in which the two rotational elements are connected such that a driving force can be transmitted via one or more transmitting members. In the present embodiment, the vehicle driving device 1 further includes an engagement device CL, a counter gear mechanism C, and a differential gear device DF. The engagement device CL, the rotary electrical machine MG, the transmission device TM, the counter gear mechanism C, and the differential gear mechanism DF are provided on a power transmission path connecting the input shaft I and the output shaft O. These elements are provided in the order of description from the input shaft I. Furthermore, the elements are accommodated in a case (driving device case) 2.

The rotary electrical machine MG is disposed coaxially with the input shaft I. The transmission device TM is disposed side by side with the rotary electrical machine MG in a direction of the rotation axis center of the input shaft I and the rotary electrical machine MG. In the present embodiment, the transmission device TM is disposed coaxially with the input shaft I and the rotary electrical machine MG. The input shaft I, the rotary electrical machine MG, and the transmission device TM are disposed in the order of description from the internal combustion engine E. The counter gear mechanism C is disposed on a different axis with the rotation axis center parallel to those of the input shaft I, and the like. Furthermore, the differential gear mechanism DF is disposed on a different axis with the rotation axis center parallel to that of the input shaft I, and the like and that of the counter gear mechanism C. The term "parallel to" refers to a parallel state or a substantially parallel state (e.g., state of intersecting at an angle of smaller than or equal to 5°).

Figure 2:
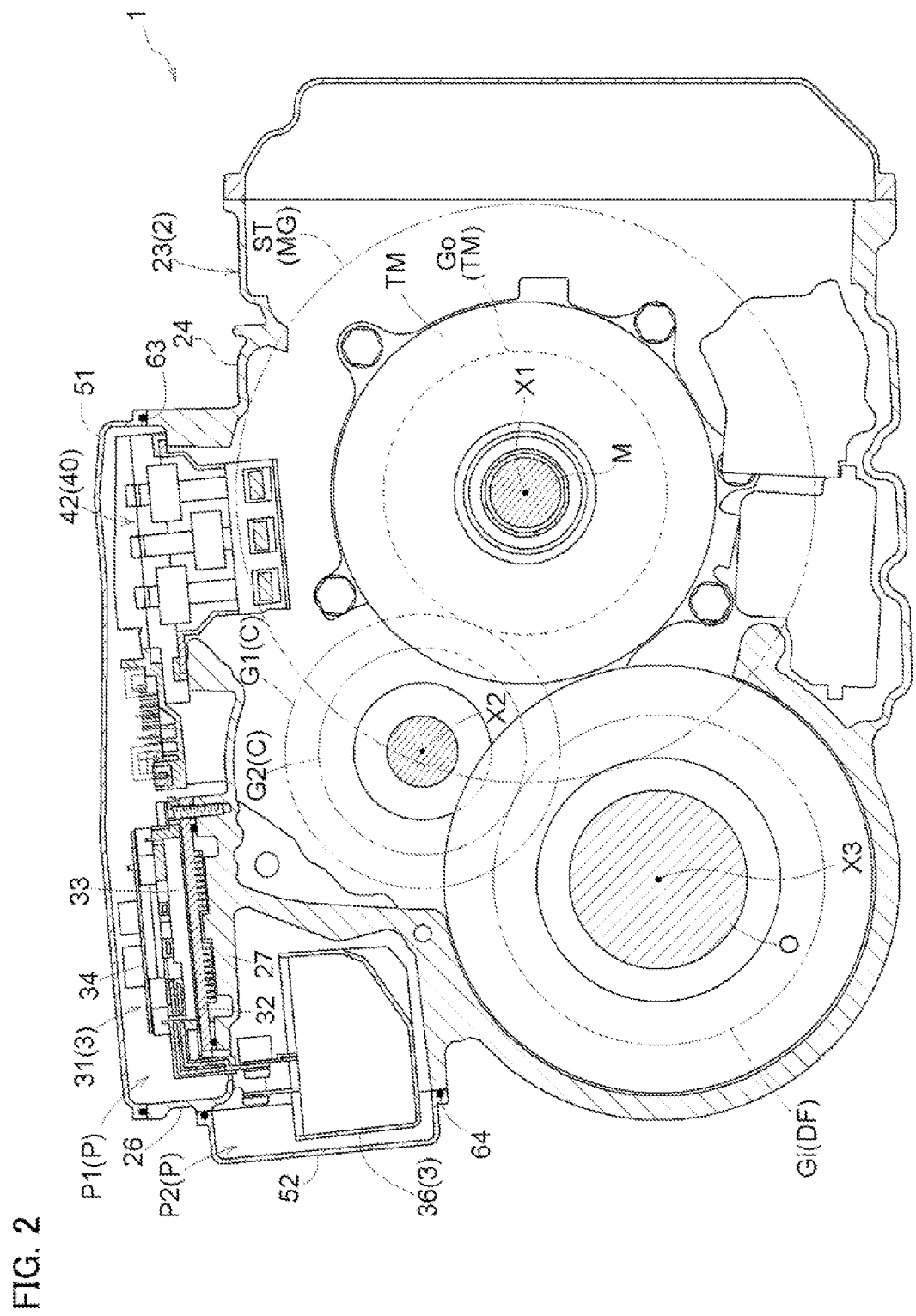
FIG. 2 is a view showing the vehicle driving device as viewed in an axial direction.

In the present embodiment, a rotation axis center common to the input shaft I, the rotary electrical machine MG, and the transmission device TM is referred to as a "first axis center X1". The rotation axis center of the counter gear mechanism C is referred to as a "second axis center X2", and the rotation axis center of the differential gear mechanism DF is referred to as a "third axis center X3". As shown in FIG. 2, the first axis center X1, the second axis center X2, and the third axis center X3 are disposed to be located at the vertices of a triangle (obtuse triangle in the present example) as viewed in an axial direction L parallel to such axis centers. Such multiple-axis configuration (three-axis configuration in the present example) is suitable as, for example, a configuration in which the vehicle driving device 1 is mounted on a Front Engine Front Drive (FF) vehicle.

In the present embodiment, a direction toward the internal combustion engine E side (right side in FIG. 1) as viewed from the rotary electrical machine MG in the axial direction L is defined as an "axial first direction L1". A direction toward the transmission device TM side (left side in FIG. 1) as viewed from the rotary electrical machine MG is defined as an "axial second direction L2".

As shown in FIG. 1, the input shaft I serving as an input member is drivingly connected to the internal combustion engine E. The internal combustion engine E is a motor (gasoline engine, diesel engine, etc.) that is driven by the combustion of fuel in the interior of the engine to extract power. The internal combustion engine E functions as a driving force source of the wheel W along with the rotary electrical machine MG In the present embodiment, the input shaft I is drivingly connected to the output shaft (crankshaft, etc.) of the internal combustion engine E. The output shaft of the internal combustion engine E and the input shaft I may be drivingly connected through a damper, and the like.

The engagement device CL is provided on the power transmission path connecting the input shaft I and the rotary electrical machine MG. The engagement device CL selectively drivingly connects the input shaft I (internal combustion engine E) and the rotary electrical machine MG. The engagement device CL functions as an engagement device for separating an internal combustion engine which separates the internal combustion engine E from the wheel W. In the present embodiment, the engagement device CL is configured as a hydraulic drive type friction engagement device. An electromagnetic drive type friction engagement device, a meshing type engagement device, and the like may also be adopted.

The rotary electrical machine MG functions as a driving force source of the wheel W along with the internal combustion engine E. The rotary electrical machine MG includes a stator St fixed to the case 2, and a rotor Ro supported rotatably on a radially inner side of the stator St. The stator St includes a stator core Sc and a coil Co disposed in the stator core Sc (see FIG. 5). The coil Co includes two coil end portions Ce projecting from the both sides of the stator core Sc in the axial direction L.

The rotary electrical machine MG can function as a motor (electric motor) that receives a supply of electric power to generate power, and also function as a generator (power generator) that receives a supply of power to generate electric power. As shown in FIG. 1, the rotary electrical machine MG is electrically connected to an electric storage device B (battery, capacitor, etc.) serving as a DC power supply through the inverter device 3. The rotary electrical machine MG receives the supply of electric power from the electric storage device B and performs power running, or supplies the electric power generated by the torque of the internal combustion engine E and the inertia force of the vehicle to the electric storage device B to store the electric power therein. The rotor Ro of the rotary electrical machine MG is drivingly connected to an intermediate shaft M so as to rotate together. The intermediate shaft M also serves as an input shaft (transmission input shaft) of the transmission device TM.

In the present embodiment, the transmission device TM is an automatic stepped transmission device that includes a plurality of gear mechanisms and a plurality of shifting engagement devices, and that can switch between a plurality of shift speeds having different speed ratios. For the transmission device TM, an automatic continuously variable transmission device that can steplessly change the speed ratio, a manual stepped transmission device that has a plurality of shift speeds having different speed ratios to be manually switchable by a driver, a constant transmission device having a single shift speed of a fixed speed ratio, and the like may be used. The transmission device TM transfers rotation and torque input to the intermediate shaft M to a transmission output gear Go, which is an output member (transmission output member) of the transmission device TM, with the speed changed at a speed ratio at each timing and with torque converted.

The transmission output gear Go is drivingly connected to the counter gear mechanism C. The counter gear mechanism C includes a first gear G1 and a second gear G2, which are each formed on a common shaft member. The first gear G1 meshes with the transmission output gear Go of the transmission device TM. The second gear G2 meshes with a differential input gear Gi of the differential gear mechanism DF. In the present embodiment, the second gear G2 is disposed on the axial first direction L1 side (internal combustion engine E side) with respect to the first gear G1. The second gear G2 is formed so as to have a smaller diameter (smaller number of teeth) than the first gear G1.

The differential gear device (output differential gear mechanism) DF is drivingly connected to the wheel W through the output shaft O serving as the output member. The differential gear mechanism DF includes a differential input gear Gi, and a differential main body portion (main body portion of the differential gear mechanism DF) coupled to the differential input gear Gi. The differential main body portion is configured to include a plurality of mutually meshing bevel gears and a differential case for accommodating the bevel gears, and plays a central role in the differential mechanism. The differential gear mechanism DF distributes and transmits the rotation and the torque input to the differential input gear Gi from the rotary electrical machine MG side through the transmission device TM and the counter gear mechanism C to two, left and right, output shafts O (that is, two, left and right, wheels W) in the differential main body portion. Thus, the vehicle driving device 1 can transmit the torque of at least one of the internal combustion engine E and the rotary electrical machine MG to the wheel W to enable the vehicle to travel.

Figure 3:
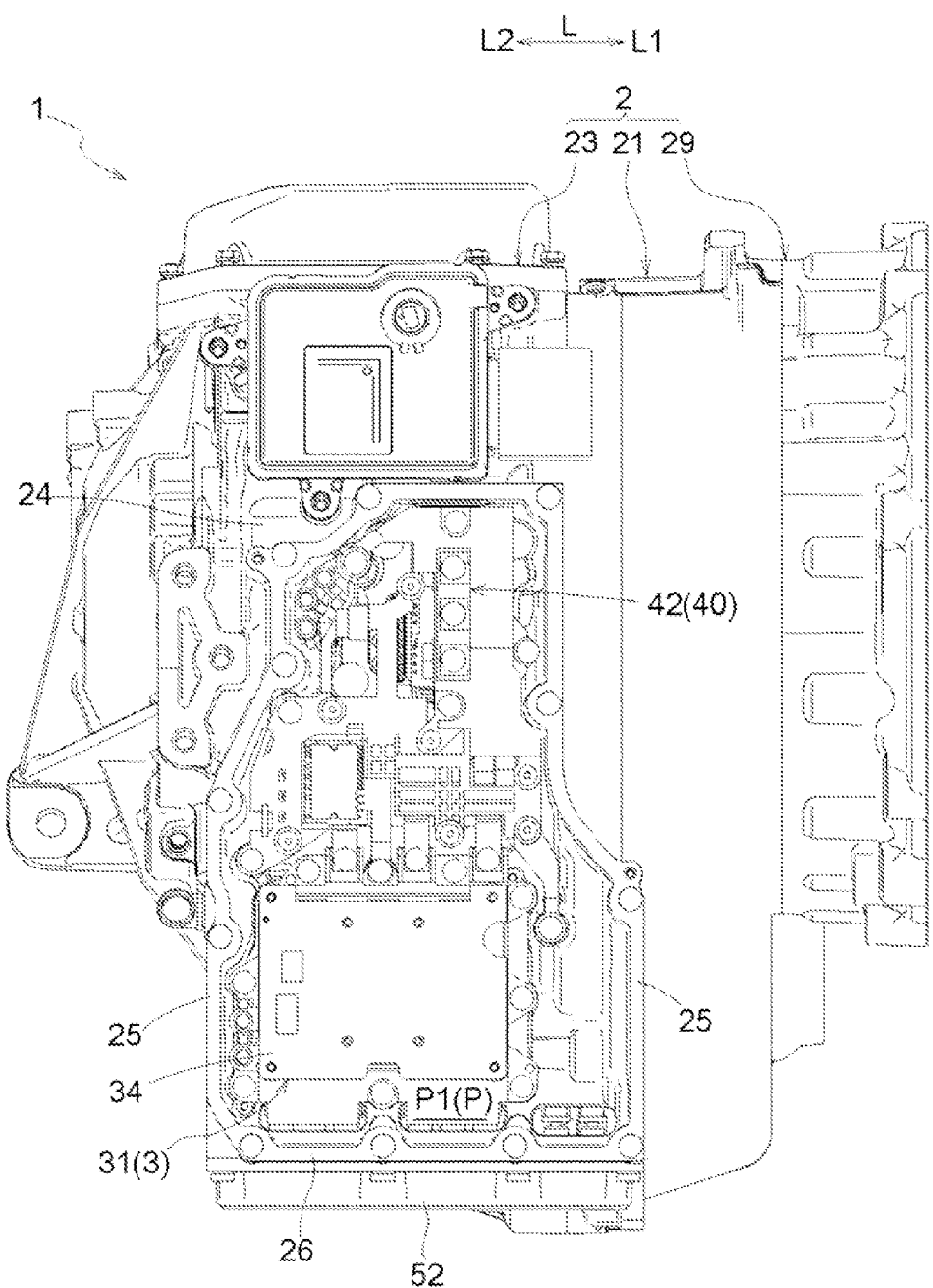
FIG. 3 is a view of the vehicle driving device as viewed in a vertical direction.

As shown in FIG. 3, the case 2 accommodating the rotary electrical machine MG, the transmission device TM, and the like includes a first case section 21 and a second case section 23 formed in a divided manner in the axial direction L. The first case section 21 mainly forms an accommodation space for the rotary electrical machine MG and the engagement device CL. The second case section 23 mainly forms an accommodation space for the transmission device TM and the counter gear mechanism C. In the present embodiment, the accommodation space for the differential gear mechanism DF is formed across the first case section 21 and the second case section 23 (see FIG. 4). The second case section 23 is joined to the first case section 21 from a side (axial second direction L2 side) opposite to the internal combustion engine E side in the axial direction L. A liquid gasket (example of a seal) such as Formed In Place Gaskets (FIPG) is disposed on the mating surface between the first case section 21 and the second case section 23.

Figure 5:
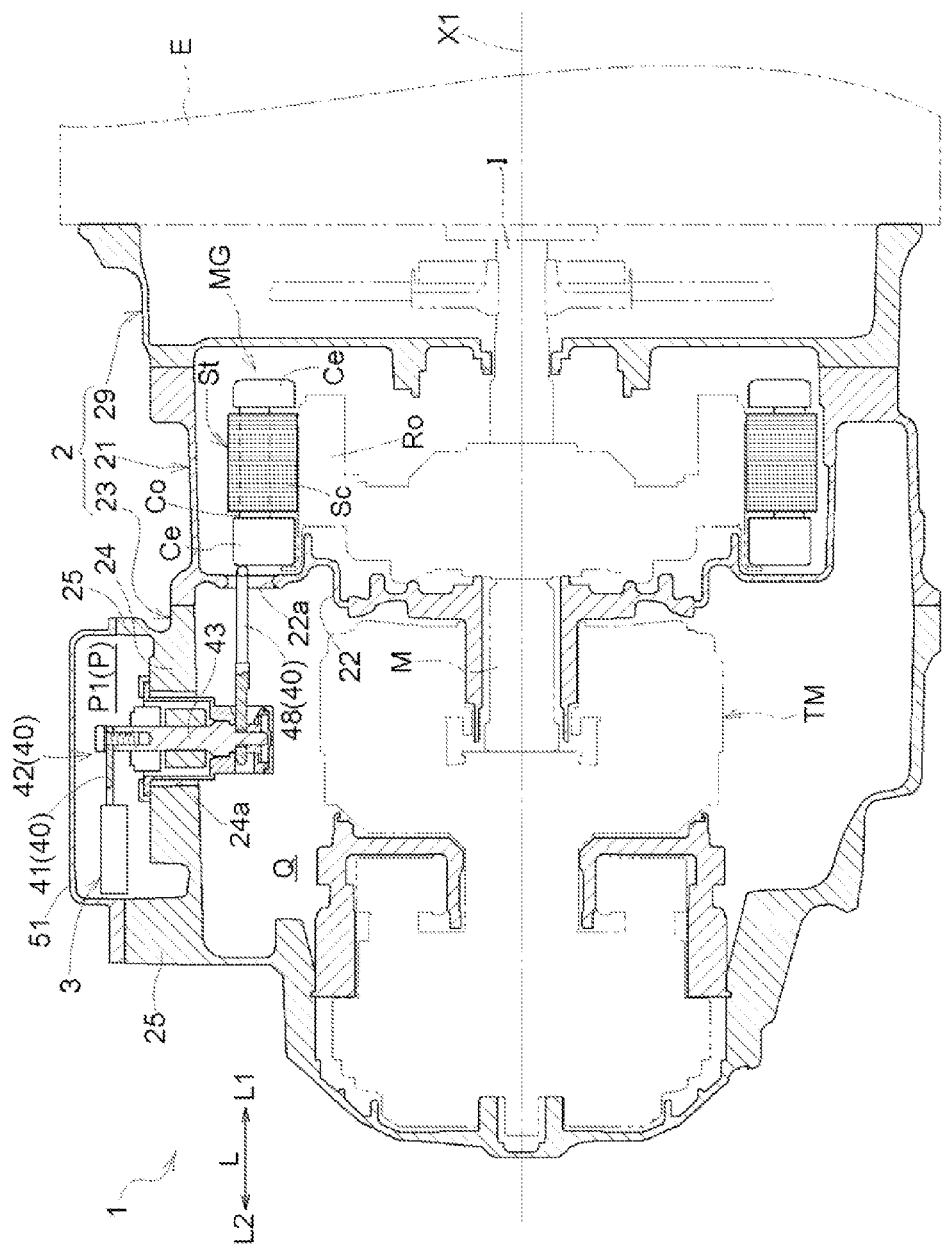
FIG. 5 is a schematic view showing a positional relationship of the components as viewed in a horizontal direction.

As shown in FIG. 5, in the present embodiment, the case 2 further includes an intermediate wall 22 disposed between the rotary electrical machine MG and the transmission device TM in the axial direction L. The intermediate wall 22 is formed as a wall portion extending in a radial direction and a circumferential direction. The intermediate wall 22 is provided on an end portion on the transmission device TM side (axial second direction L2 side) in the first case section 21, The intermediate wall 22 includes a plurality of through holes (a through hole where the intermediate shaft M is disposed, a through hole 22a where a connection cable 48 to be described later is disposed) that pass through the intermediate wall 22 in the axial direction L. The accommodation space for the rotary electrical machine MG and the engagement device CL, the accommodation space for the transmission device TM and the counter gear mechanism C, and the accommodation space for the differential gear mechanism DF are communicated with each other through the through holes. The common spaces in communication with each other are formed to an oil-tight manner (state in which oil is internally sealed). In other words, the spaces are combined with the first case section 21 and the second case section 23 joined to form a common oil-tight communication space Q. The oil-tight communication space Q constitutes a "driving element accommodation chamber" for accommodating the main driving elements of the vehicle driving device 1 such as the rotary electrical machine MG, the engagement device CL, the transmission device TM, the counter gear mechanism C, the differential gear mechanism DF, and the like. In the present embodiment, the oil-tight communication space Q corresponds to a "communicated oil-tight space" in the present disclosure.

In the present example, a configuration in which the vehicle driving device 1 includes a damper is illustrated, where a third case section 29 forming an accommodation space for the damper is joined to the first case section 21 from the internal combustion engine E side (axial first direction L1 side), Thus, the third case section 29, the first case section 21, and the second case section 23 are disposed such that the length of the separation along the axial direction L from the internal combustion engine E becomes larger in the order of description.

As shown in FIG. 2, the inverter device 3 that controls the rotary electrical machine MG is integrated with the case 2. The inverter device 3 is directly fixed and integrated with the case 2 without interposing an inverter case, and the like for accommodating the inverter device 3. In other words, in the vehicle driving device 1 according to the present embodiment, an inverter case-less structure is adopted. In such inverter case-less structure, a dedicated inverter case does not need to be provided, of course, and a fixing seat for fixing the inverter case to the case 2 also does not need to be provided, either. Thus, the reduction in the number of components leads to reduction in cost. The entire device can also be downsized.

As well shown in FIG. 3, in the present embodiment, the inverter device 3 is fixed to the second case section 23 for accommodating the transmission device TM, and the like not to the first case section 21 for accommodating the rotary electrical machine MG, and the like. In the present embodiment, a thin rotary electrical machine MG having a large diameter is used to suppress the length in the axial direction L of the entire device to be short (see FIG. 5). Thus, the transmission device TM has a small diameter compared to the rotary electrical machine MG, and an annular space formed by the difference between the outer diameter of the rotary electrical machine MG and the outer diameter of the transmission device TM is formed on a radially outer side of the transmission device TM. At least a part of the annular space is effectively utilized to dispose the inverter device 3, so that the entire vehicle driving device 1 including the inverter device 3 to be integrated is downsized.

Furthermore, the inverter device 3 is fixed only to the second case section 23 disposed on the side opposite to the internal combustion engine E with respect to the first case section 21. Such configuration is advantageous in that a first cover member 51 for forming an inverter accommodation chamber P (first accommodating section P1) between the case 2 and the first cover member 51 can be fitted only within a range in the axial direction L occupied by the second case section 23. In other words, for example, the physical size of the entire device can be reduced compared to the case where the first cover member 51 is disposed across the first case section 21 and the second case section 23. Moreover, the inverter device 3 is disposed so as to be spaced apart from the internal combustion engine E by greater than or equal to an axial length of the first case section 21. Thus, the inverter device 3 can be disposed in a relatively large space while avoiding auxiliary machines to be disposed in the vicinity of the internal combustion engine E. As a result, even if the inverter device 3 projects toward the radially outer side (upper side in the present example) slightly more than the transmission device TM and the rotary electrical machine MG, inconvenience in mounting the vehicle driving device 1 on the vehicle hardly occurs. Furthermore, the heat of the internal combustion engine E can be prevented from affecting the inverter device 3.

As shown in FIGS. 2 and 3, the second case section 23 includes an outer peripheral wall 24 formed in a deformed tubular shape along the outer shapes of the transmission device TM, the counter gear mechanism C, and the differential gear mechanism DF, and a pair of projecting walls 25 disposed facing each other so as to project toward the outer side from the outer peripheral wall 24. A space defined by the outer peripheral wall 24 and the pair of projecting walls 25 is the inverter accommodation chamber P. Thus, the inverter accommodation chamber P is formed along the outer peripheral wall 24 of the case 2 (second case section 23). The inverter device 3 is accommodated in the inverter accommodation chamber P. The inverter device 3 is integrally fixed to the case 2 (second case section 23) in the inverter accommodation chamber P.

The inverter device 3 includes a conversion unit 31 and a capacitor 36. The conversion unit (DC/AC conversion unit) 31 converts the DC electric power and the AC electric power. As shown in FIG. 2, the conversion unit 31 includes a flat plate-shaped base plate 32, and a plurality of switching elements 33 fixed on the base plate 32. The base plate 32 is composed of a material having high heat conductivity (e.g., metal material such as copper, aluminum, and the like), and also functions as a heat sink. An insulated gate bipolar transistor (IGBT), a metal oxide semiconductor field effect transistor (MOSFET), and the like, for example, are used for the switching element 33. The conversion unit 31 includes a rectifying element made from a diode, and the like, for example, and the rectifying element is connected in parallel with respect to the switching element 33. A control substrate 34 for controlling the switching of the switching element 33 is fixed to the base plate 32.

The capacitor 36 smoothes (suppresses fluctuation of) the DC electric power exchanged between the electric storage device B and the conversion unit 31. A film capacitor made of synthetic resin, a ceramic capacitor made of inorganic material, and the like, for example, can be used for the capacitor 36. Such capacitor 36 has a relatively large degree of design freedom regarding the size and shape, and can be adjusted according to the size and shape of the space in which the capacitor 36 is disposed in. The inverter device 3 may further include various components for constituting a boost circuit.

Figure 4:
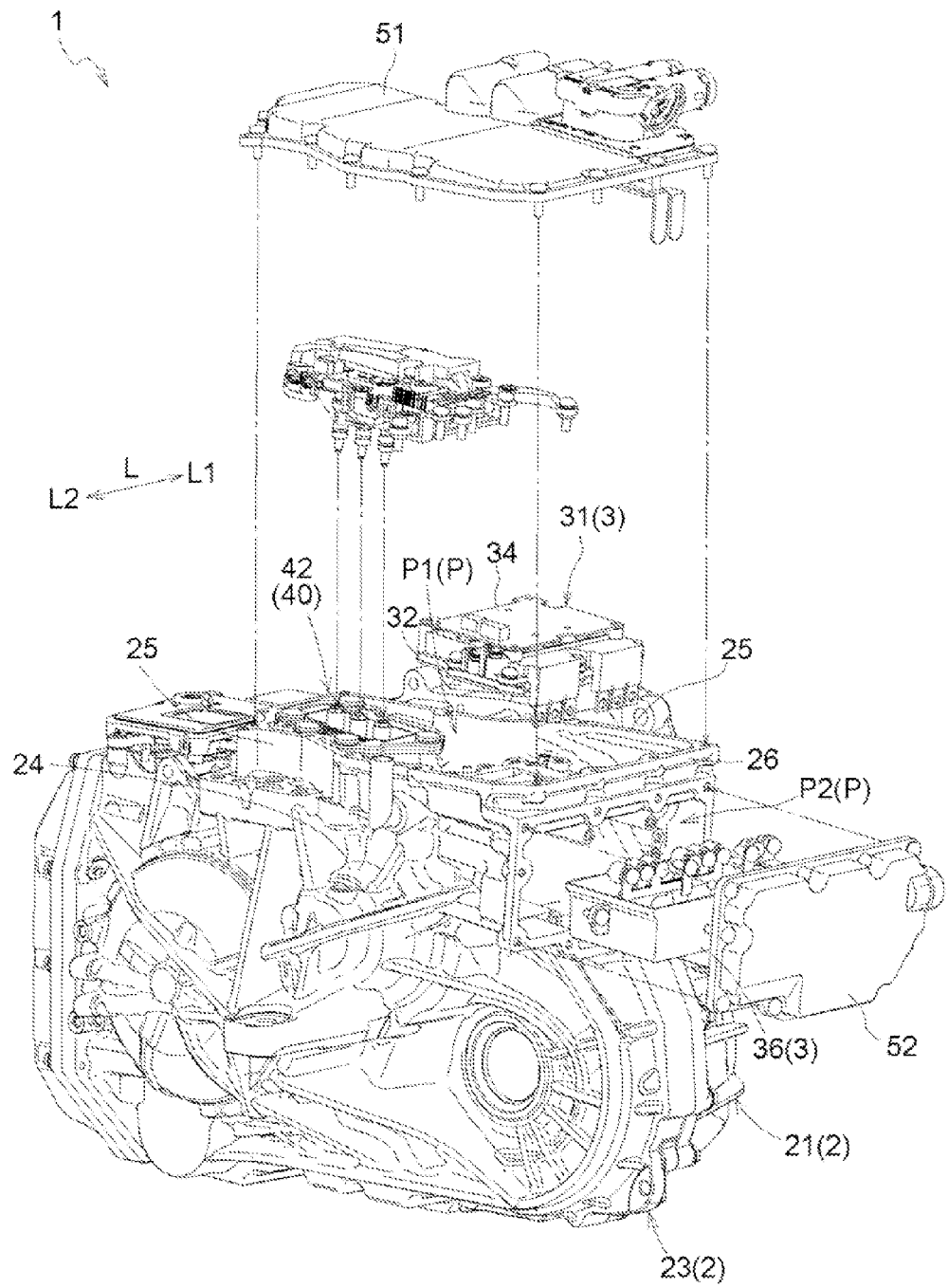
FIG. 4 is an exploded perspective view of the vehicle driving device.

As shown in FIGS. 3 and 4, in the present embodiment, the case 2 includes a crossing wall portion 26 that connects the pair of projecting walls 25. The case 2 includes a plate-shaped isolation wall 27 (see FIG. 2) extending from the outer peripheral wall 24 toward the crossing wall portion 26. The inverter accommodation chamber P is partitioned into a first accommodating section P1 and a second accommodating section P2 by the isolation wall 27. The first accommodating section P1 accommodates the conversion unit 31 and the second accommodating section P2 accommodates the capacitor 36.

As shown in FIGS. 2 and 4, the first accommodating section P1 and the second accommodating section P2 open in directions different from each other. Specifically, the first accommodating section P1 opens toward the upper side, and the second accommodating section P2 opens toward the side. The conversion unit 31 thus can be inserted to the first accommodating section P1 from the upper side along the vertical direction, and fixed to the second case section 23. The capacitor 36 can be inserted to the second accommodating section P2 from the side along the horizontal direction and fixed to the second case section 23. The conversion unit 31 and the capacitor 36 can be fixed to the second case section 23 by processes independent from each other. Note that each of the first cover member 51 and the second cover member 52 is joined to the second case section 23 in this state. The first cover member 51 covers the first accommodating section P1 constituting the inverter accommodation chamber P, and the second cover member 52 covers the second accommodation chamber P2. In the present embodiment, each of the first cover member 51 and the second cover member 52 corresponds to a "cover member" in the present disclosure.

As shown in FIG. 5, the wiring member 40 is provided to electrically connect the inverter device 3 and the rotary electrical machine MG (coil Co of the stator St). In the present embodiment, the wiring member 40 is provided to pass through the second case section 23 so as to cross the inverter accommodation chamber P (first accommodating section P1) and the oil-tight communication space Q. The wiring member 40 is disposed in the oil-tight communication space Q so as to cross the second case section 23 and the first case section 21. Thus, the wiring member 40 connected to the inverter device 3 in the inverter accommodation chamber P is thus passed through the second case section 23 and guided to the oil-tight communication space Q, and connected to the rotary electrical machine MG in the oil-tight communication space Q.

Figure 6:
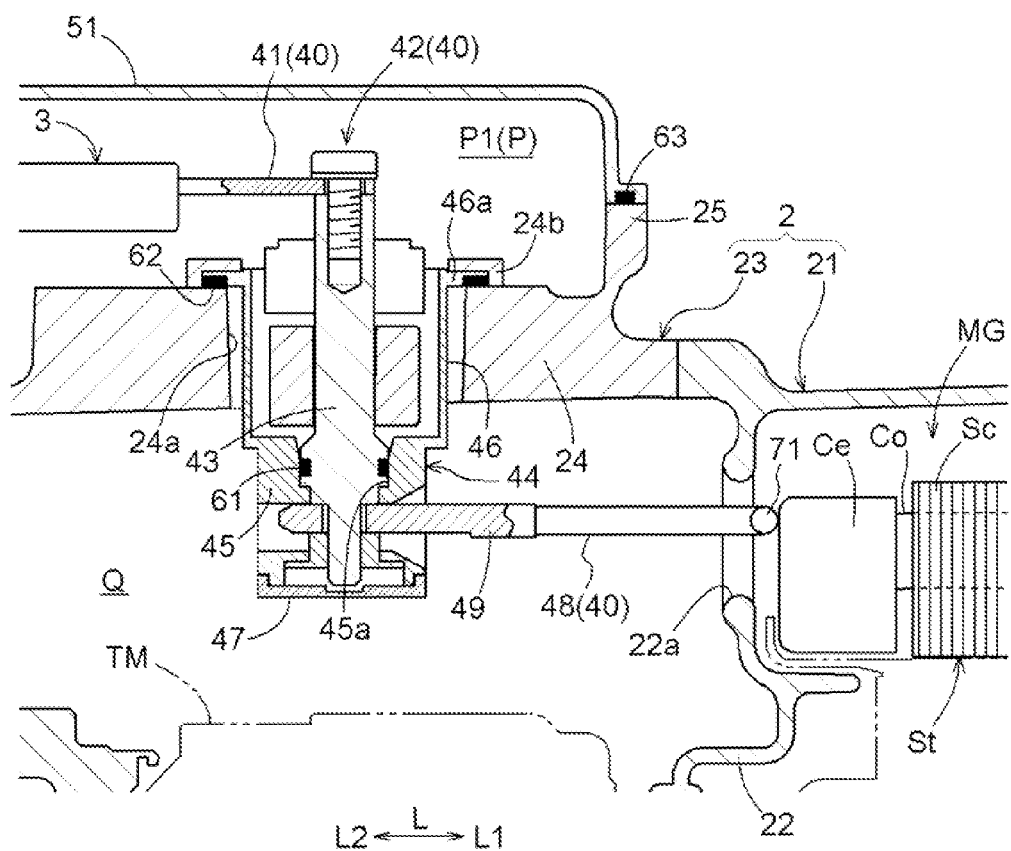
FIG. 6 is a partially enlarged view of FIG. 5.

As shown in FIG. 6, the wiring member 40 includes a bus bar 41, a terminal unit 42, and a connection cable 48. The bus bar 41 electrically connects the inverter device 3 (conversion unit 31 in the present example) and the terminal unit 42. The bus bar 41 is composed of a band-shaped conductor plate made of metal. In the present embodiment, the rotary electrical machine MG is configured to be driven by a three phase AC electric power, and the bus bar 41 for each phase is provided to correspond to the three phases of the coil Co. The bus bar 41 is disposed to extend along the substantially horizontal direction.

The terminal unit 42 electrically connects the bus bar 41 and the connection cable 48. The terminal unit 42 is a unit in which a first relay terminal 43 and a holding stand 44 for holding the first relay terminal 43 are integrated. The bus bar 41 is fixed to the first relay terminal 43 by a fastening member such as a bolt, and the like. In the present embodiment, the first relay terminal 43 for each phase is provided to correspond to the bus bars 41 of the three phases. A total of three first relay terminals 43, one for each phase, are collectively held by one holding stand 44. The first relay terminal 43 is composed of a rod-shaped conductor made of metal. The first relay terminal 43 is disposed to substantially extend in the vertical direction. The holding stand 44 is, for example, composed of an insulating material such as resin, and the like.

The holding stand 44 includes a main body portion 45, a leg portion 46, and a lid portion 47. The main body portion 45 is a portion that plays a core role in holding the first relay terminal 43. The main body portion 45 is formed in a block shape, and includes a plurality of through holes 45a (three through holes corresponding to the number of first relay terminals 43) extending along the vertical direction. The inner diameter of the through hole 45a corresponds to the outer diameter of the first relay terminal 43. When a portion on the lower end side of the first relay terminal 43 is inserted to the through hole 45a, the first relay terminal 43 is held by the holding stand 44.

The leg portion 46 extending along the vertical direction is provided on the upper side of the main body portion 45 in the holding stand 44. The leg portion 46 is formed in a thin-plate shape, the thickness of which is smaller than the length in the vertical direction. Furthermore, the leg portion 46 is disposed on an outer edge portion of the main body portion 45 as viewed in the vertical direction. In the present embodiment, the main body portion 45 is formed in a substantially rectangular shape as viewed in the vertical direction (not shown), and four leg portions 46 are disposed so as to surround the respective four sides of the main body portion 45. The main body portion 45 and the four leg portions 46 are integrally formed. Furthermore, the holding stand 44 is formed in a tank shape by the main body portion 45 and the four leg portions 46 so as to open toward the upper side. Moreover, a flange-shaped lock piece 46a extending toward the outer side along the horizontal direction is provided on the upper end portion of each of the leg portions 46. The leg portion 46 and the lock piece 46a are integrally formed.

In the present embodiment, the outer peripheral wall 24 of the second case section 23 includes a through hole 24a that communicates the inverter accommodation chamber P (first accommodating section P1) and the oil-tight communication space Q. When the terminal unit 42 is disposed in the through hole 24a, the wiring member 40 is provided to pass through the second case section 23. A receiving portion 24b having an L-shaped cross-section is provided toward the center side of the through hole 24a at the periphery of the through hole 24a on the surface of the outer peripheral wall 24 on the inverter accommodation chamber P side. The holding stand 44 is stably fixed by the receiving portion 24b engaged with the lock piece 46a.

A second relay terminal 49 provided integrally with the connection cable 48 is connected to the lower end portion of the first relay terminal 43. In the present embodiment, the second relay terminal 49 for each phase is provided to correspond to each of the first relay terminals 43 of the three phases. The second relay terminal 49 is composed of a band-shaped conductor plate made of metal. The lid portion 47 is attached to the main body portion 45 from the lower side so as to cover the connecting area between the first relay terminals 43 and the second relay terminals 49.

The connection cable 48 electrically connects the terminal unit 42 and the rotary electrical machine MG (coil Co of the stator St). The connection cable 48 is composed of a conductor wire made of metal and an insulating covering material that covers the periphery of the conductor line. The integrated second relay terminal 49 and connection cable 48 are disposed to linearly extend in the substantially axial direction L. The connection cable 48 is disposed at a position overlapping the stator St of the rotary electrical machine MG as viewed in the axial direction L on the radially outer side of the transmission device TM. The connection cable 48 is disposed at a position overlapping only the stator St without overlapping the rotor Ro as viewed in the axial direction L on the radially outer side of the rotor Ro. Although the intermediate wall 22 is provided between the transmission device TM and the rotary electrical machine MG in the axial direction L, the through hole 22a passing through the intermediate wall 22 in the axial direction L is formed at the position in the intermediate wall 22 overlapping the connection cable 48 and the stator St as viewed in the axial direction L. The connection cable 48 constituting the wiring member 40 is thus provided to pass through the through hole 22a formed in the intermediate wall 22 in the oil-tight communication space Q.

The connection cable 48 is connected to the connection terminal 71 provided in the coil Co. The connection cable 48 for each phase is connected to the connection terminal 71 of the coil Co for each phase. Such connection terminal 71 is provided at the coil end portion Ce projecting in the axial direction L from the stator core Sc in the coil Co. In the present embodiment, the connection terminal 71 is provided at the coil end portion Ce on the transmission device TM side (axial second direction L2 side) in the axial direction L of the two coil end portions Ce on both sides in the axial direction L. Thus, the connection cable 48 extending in the axial direction L from the internal space of the second case section 23 disposed on the axial second direction L2 side with respect to the rotary electrical machine MG toward the axial first direction L1 side can be connected to the connection terminal 71 at the shortest distance.

A predetermined amount of oil is stored in the oil-tight communication space Q formed between the first case section 21 and the second case section 23, which are joined to each other, to appropriately perform cooling, lubrication, and the like of the rotary electrical machine MG, the transmission device TM, and the like. The oil scatters in the oil-tight communication space Q when raked up by the differential input gear Gi of the differential gear mechanism DF, for example, during the travelling of the vehicle. Meanwhile, the inverter accommodation chamber P formed between the first cover member 51 joined to the second case section 23 and the second cover member 52 joined to the second case section 23 includes electronic components such as the switching element 33, and the like, and thus the liquid such as water, oil, and the like needs to be prevented from mixing therein. The vehicle driving device 1 according to the present embodiment includes a first seal member 61 and a second seal member 62 for sealing between the second case section 23 and the wiring member 40 passing through the second case section 23. In the present embodiment, the first seal member 61 and the second seal member 62 respectively corresponds to a "seal member" in the present disclosure. The vehicle driving device 1 includes a third seal member 63 for sealing between the second case section 23 and the first cover member 51 joined to the second case section 23 and a fourth seal member 64 for sealing the second case section 23 and the second cover member 52 joined to the second case section 23 (see FIG. 2).

As shown in FIG. 6, the first seal member 61 is disposed between the first relay terminal 43 and the through hole 45a in the main body portion 45 of the holding stand 44. In the present embodiment, the first seal member 61 for each phase is provided so as to correspond to each of the first relay terminals 43 of the three phases. An O-ring, an X-ring, and the like composed of a rubber material such as nitrile rubber, styrene rubber, silicone rubber, fluorine-contained rubber, and the like can be used for the first seal member 61. Furthermore, the liquid gasket such as FIPG, and the like can be used. Thus, the entry of the oil in the oil-tight communication space Q into the inverter accommodation chamber P through a small gap between the first relay terminal 43 and the holding stand 44 (main body portion 45) can be effectively suppressed.

As shown in FIG. 6, the second seal member 62 is disposed between the outer peripheral wall 24 of the second case section 23 and the lock piece 46a of the leg portion 46 of the holding stand 44. In the present embodiment, one second seal member 62 is provided so as to correspond to the one holding stand 44 collectively holding the first relay terminals 43 of the three phases. An O-ring, an X-ring, and the like composed of a rubber material such as nitrile rubber, styrene rubber, silicone rubber, fluorine-contained rubber, and the like can be used for the second seal member 62. Furthermore, a liquid gasket such as FIPG, and the like can be used. Thus, the entry of the oil in the oil-tight communication space Q into the inverter accommodation chamber P through a small gap between the outer peripheral wall 24 and the holding stand 44 (leg portion 46) can be effectively suppressed.

As shown in FIG. 6, the third seal member 63 is disposed on the mating surface of the projecting wall 25 of the second case section 23 and the first cover member 51. In the present embodiment, the first cover member 51 is joined only to the second case section 23 without crossing the first case section 21 and the second case section 23. Thus, for example, a step that may inevitably be formed in manufacturing in the area of the mating surface between the first case section 21 and the second case section 23 does not need to be taken into consideration. Therefore, a liquid gasket such as FIPG, and the like can be used for the third seal member 63 without using a cork gasket, a foamed rubber, a grommet, and the like that can absorb such step. An O-ring, an X-ring, and the like composed of a rubber material can also be used, of course, and a cork gasket, a foamed rubber, a grommet, and the like can also be used. Thus, the moisture can be effectively prevented from externally entering the inverter accommodation chamber P through a small gap between the second case section 23 and the first cover member 51.

As shown in FIG. 2, the fourth seal member 64 is disposed on the mating surface between the outer peripheral wall 24 and the crossing wall portion 26 of the second case section 23, and the second cover member 52. In the present embodiment, the second cover member 52 is joined only to the second case section 23. A liquid gasket such as FIPG, and the like can be used for the fourth seal member 64. An O-ring, an X-ring, and the like composed of a rubber material can be used, of course, and a cork gasket, a foamed rubber, a grommet, and the like can also be used. Thus, the moisture can be effectively prevented from externally entering the inverter accommodation chamber P through a small gap between the second case section 23 and the second cover member 52.

In the present embodiment, the small gap existing in the wiring member 40 itself (between the second case section 23 and the wiring member 40 in a broad sense) can be appropriately sealed through a simple method using the first seal member 61 composed of an O-ring, an X-ring, and the like. Furthermore, the small gap between the second case section 23 and the wiring member 40 can be appropriately sealed through a simple method using the second seal member 62 composed of an O-ring, an X-ring, and the like. Furthermore, a small gap without a step between the second case section 23, and the first cover member 51 and the second cover member 52 can be appropriately sealed using the third seal member 63 and the fourth seal member 64 composed of a liquid gasket, and the like, respectively. Thus, the seal structure of the inverter accommodation chamber P can be simplified.

[Other Embodiments]

Lastly, other embodiments of the vehicle driving device according to the present disclosure will be described. Note that the configuration disclosed in each of the following embodiments can be applied in combination with the configuration disclosed in other embodiments unless inconsistency occurs.

(1) In the embodiment described above, the configuration in which the through hole 22*a* is formed at the position overlapping the rotary electrical machine MG (specifically, stator St) as viewed in the axial direction L in the intermediate wall 22 has been described as an example. However, the embodiment of the present disclosure is not limited to this example. For example, the through hole 22*a* may be formed at the position overlapping the rotor Ro without overlapping the stator St as viewed in the axial direction L. The through hole 22*a* may be formed at the position not overlapping the rotary electrical machine MG as viewed in the axial direction L on the radially outer side from the rotary electrical machine MG.

(2) In the embodiment described above, the configuration in which the intermediate wall 22 is provided on the end portion on the transmission device TM side (axial second direction L2 side) in the first case section 21 has been described as an example. However, the embodiment of the present disclosure is not limited to this example. For example, the intermediate wall 22 may be provided on the end portion on the rotary electrical machine MG side (axial first direction L1 side) in the second case section 23. The intermediate wall 22 may be provided at any position in the axial direction L in the first case section 21 or the second case section 23.

(3) In the embodiment described above, the configuration in which the connection terminal 71 of the coil Co is provided on the coil end portion Ce on the transmission device TM side of the two coil end portions Ce on both sides in the axial direction L has been described as an example. However, the embodiment of the present disclosure is not limited this example. For example, the connection terminal 71 may be provided on the coil end portion Ce on the internal combustion engine E side.

(4) In the embodiment described above, the wiring member 40 including the terminal unit 42 has been described by illustrating the specific structure as an example. However, the embodiment of the present disclosure is not limited to this example. Any specific structure can be adopted for the wiring member 40 (in particular, terminal unit 42). In the embodiment described above, an example in which the first relay terminals 43 for each of the phases are collectively held by one holding stand 44 has been described. However, for example, the first relay terminals 43 for each of the phases may be individually held by the holding stand 44 corresponding to each phase. In other words, in this case, the terminal unit 42 for each phase is individually provided. Furthermore, for example, the connection cable, and the like may be used for connecting the inverter device 3 and the terminal unit 42. A bus bar, and the like may be used for connecting the terminal unit 42 and the rotary electrical machine MG.

(5) In the embodiment described above, an example in which the first cover member 51 and the second cover member 52 are joined to the second case section 23 to constitute the inverter accommodation chamber P has been described. However, the embodiment of the present disclosure is not limited to this example. For example, a wall portion corresponding to the second cover member 52 may be integrally formed with the second case section 23, and only the first cover member 51 may be joined to the second case section 23 to constitute the inverter accommodation chamber P. Accordingly, the installation of the fourth seal member 64 can be omitted, which is advantageous from the standpoint of sealing property of the inverter accommodation chamber P. However, since the capacitor 36 and the conversion unit 31 need to be sequentially inserted from the upper side along the vertical direction, either the isolation wall 27 needs to be configured to be removably attached or the installation of the isolation wall 27 itself needs to be omitted.

(6) In the embodiment described above, the description has been made assuming the transmission device TM having a uniaxial configuration in which the intermediate shaft M serving as a transmission input shaft and the transmission output gear Go serving as a transmission output member are coaxially disposed. However, the embodiment of the present disclosure is not limited to this configuration. For example, the transmission device TM having a multiple-axis configuration in which the transmission input shaft and the transmission output member are disposed on different axes may be used. In this case as well, the rotation axis center (first axis center X1) of the transmission device TM is defined based on the rotation axis center of the input shaft (transmission input shaft) of the transmission device TM. In this case, the phrase "the transmission device TM is coaxially disposed with the rotary electrical machine MG" means that the rotation axis center of the transmission input shaft coincides with the rotation axis center of the rotary electrical machine MG (rotor Ro), where the rotation axis center of the transmission output member may not coincides with the rotation axis center of the rotary electrical machine MG (rotor Ro).

(7) The embodiments disclosed in the present specification are illustrative in all respects regarding other configurations as well, and should be recognized that such embodiments do not limit the scope of the disclosure. Those skilled in the art should easily recognize that modifications can be appropriately made without departing from the scope of the disclosure. Therefore, other embodiments modified without departing from the scope of the disclosure are also included in the scope of the disclosure.

INDUSTRIAL APPLICABILITY

The present disclosure can be used, for example, in the driving device for the hybrid vehicle.

The invention claimed is:

1. A vehicle driving device comprising:
   a rotary electrical machine that functions as a driving force source of a wheel along with an internal combustion engine;
   a transmission device that is disposed side by side with respect to the rotary electrical machine in an axial direction, the axial direction being a direction in which a rotation axis center of the rotary electrical machine extends;
   a case including a first case section that accommodates the rotary electrical machine and a second case section that accommodates the transmission device;
   an inverter device that controls the rotary electrical machine; and
   a wiring member that connects the rotary electrical machine and the inverter device; wherein
   an oil-tight space, in which the first case section and the second case section are communicated, is formed, the second case section being joined to a side opposite to the internal combustion engine side in the axial direction of the first case section;
   an inverter accommodation chamber that accommodates the inverter device is formed between the second case section and a cover member joined to the second case section;
   the rotary electrical machine is accommodated in the oil-tight space;
   the wiring member is provided to pass through the second case section so as to cross the inverter accommodation chamber and the oil-tight space; and
   a seal member that seals between the second case section and the wiring member is provided.

2. The vehicle driving device according to claim 1, wherein
   the case further includes an intermediate wall disposed between the rotary electrical machine and the transmission device in the axial direction;
   the wiring member is provided through a through hole formed in the intermediate wall in the oil-tight space; and
   the through hole is formed at a position overlapping the rotary electrical machine as viewed in the axial direction.

3. The vehicle driving device according to claim 1, wherein
   the rotary electrical machine includes a stator with a stator core and a coil disposed in the stator core;
   the coil includes two coil end portions projecting from the both sides of the stator core in the axial direction; and
   a connection terminal of the coil with the wiring member is provided on the coil end portion on the transmission device side in the axial direction of the two coil end portions.

4. The vehicle driving device according to claim 2, wherein
   the rotary electrical machine includes a stator with a stator core and a coil disposed in the stator core;
   the coil includes two coil end portions projecting from the both sides of the stator core in the axial direction; and
   a connection terminal of the coil with the wiring member is provided on the coil end portion on the transmission device side in the axial direction of the two coil end portions.

* * * * *